United States Patent
Cho et al.

(10) Patent No.: US 8,648,644 B2
(45) Date of Patent: Feb. 11, 2014

(54) SWITCH CONTROL DEVICE

(75) Inventors: Kunhee Cho, Seoul (KR); Sung-Yun Park, Bucheon (KR); Donghwan Kim, Bucheon (KR)

(73) Assignee: Fairchild Korea Semiconductor Ltd., Bucheon (KR)

(*) Notice: Subject to any disclaimer, the term of this patent is extended or adjusted under 35 U.S.C. 154(b) by 18 days.

(21) Appl. No.: 13/188,727

(22) Filed: Jul. 22, 2011

(65) Prior Publication Data
US 2012/0025886 A1  Feb. 2, 2012

(30) Foreign Application Priority Data
Jul. 29, 2010 (KR) .................. 10-2010-0073628

(51) Int. Cl.
*H03K 17/687* (2006.01)
(52) U.S. Cl.
USPC .............................. 327/427; 327/378; 307/66
(58) Field of Classification Search
USPC .......... 327/378, 427, 403, 404, 66, 126, 130, 327/140
See application file for complete search history.

(56) References Cited

U.S. PATENT DOCUMENTS

| | | | | |
|---|---|---|---|---|
| 5,572,156 A * | 11/1996 | Diazzi et al. | .................. | 327/109 |
| 5,952,865 A * | 9/1999 | Rigazio | .................. | 327/333 |
| 6,075,400 A * | 6/2000 | Wu et al. | .................. | 327/382 |
| 6,121,694 A * | 9/2000 | Thereze | .................. | 307/64 |
| 7,323,825 B2 * | 1/2008 | Hwang et al. | .................. | 315/224 |
| 2011/0291709 A1* | 12/2011 | Kim et al. | .................. | 327/134 |
| 2011/0309680 A1* | 12/2011 | Oleksiewicz | .................. | 307/66 |

OTHER PUBLICATIONS

Mitsubishi Electric—HVIC Application Note, Mar. 2009, pp. 1-17.

* cited by examiner

*Primary Examiner* — Lincoln Donovan
*Assistant Examiner* — Jung H Kim
(74) *Attorney, Agent, or Firm* — Okamoto & Benedicto LLP (57) ABSTRACT

The switch control device controls a switching operation of a power switch. The switch control device includes an auxiliary power device. The auxiliary power device includes a parasitic capacitor, and charges the parasitic capacitor by receiving a power voltage to generate an auxiliary power voltage. The switch control device includes a control pulse generator driven by the auxiliary power voltage and generating a set pulse and a reset pulse according to an input signal that is input for controlling the switching operation of the power switch. The switch control device generates a gate signal that turns on the power switch by being synchronized with the set pulse and generates a gate signal that turns off the power switch by being synchronized with the reset pulse.

16 Claims, 6 Drawing Sheets

SWITCH CONTROL DEVICE

CROSS-REFERENCE TO RELATED APPLICATION

This application claims priority to and the benefit of Korean Patent Application No. 10-2010-0073628 filed in the Korean Intellectual Property Office on Jul. 29, 2010, the entire contents of which are incorporated herein by reference.

BACKGROUND OF THE INVENTION (a) Field of the Invention

The present invention relates to a switch control device. More particularly, the present invention relates to a switch control device that controls a switching operation of a power switch that supplies a high-voltage.

(b) Description of the Related Art

A switch control device that controls a switching operation of a power switch is supplied with power for operation. In general, the switch control device senses a power voltage and does not operate when the power voltage is lower than a predetermined low voltage. This is because that the switch control device may malfunction if the power voltage is low.

However, when the power voltage is decreased lower than a low voltage, the switch control device may not sense the decrease of the power voltage so that an output of the switch control device may be latched. Particularly, when the output of the switch control device is latched to a level that turns on the power switch, the power switch may be damaged or excessive power may be supplied.

In further detail, when the power switch is a high-voltage power switch that supplies power to a load from a high-voltage side and the output of the switch control device is latched to the level that turns on the power switch, excessive power is supplied to the load from the high-voltage, and a current flowing to the power switch may cause generation of excessive heat. The heat may cause damage not only to the power switch but also the switch control device that controls the power switch.

Figure 1:
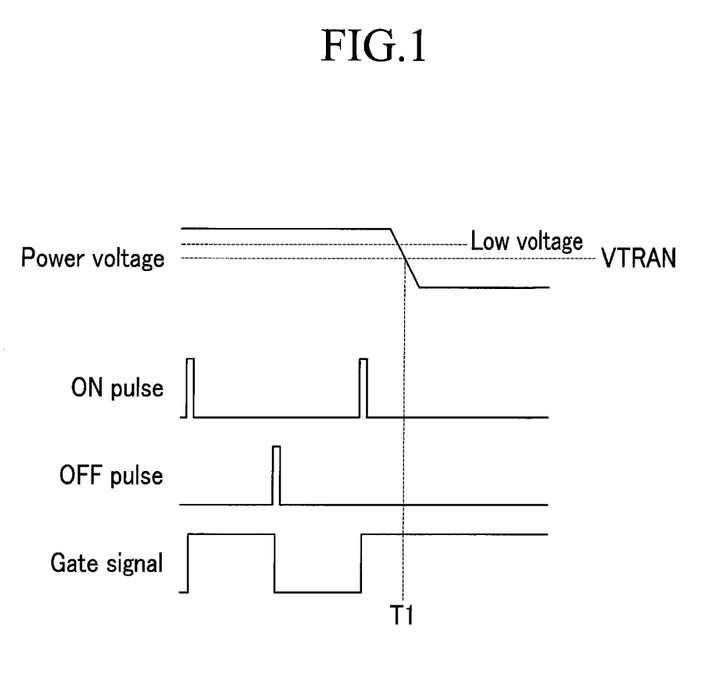
FIG. 1 shows a case that an output of a switch control device is latched when a power voltage is decreased lower than a low voltage.

FIG. 1 shows a case that the output of the switch control device is latched when the power voltage is decreased lower than the low voltage. A gate signal OUT is a signal that turns on/off the power switch.

As shown in FIG. 1, a gate signal OUT is synchronized with an ON pulse and thus increased to a high level, and is synchronized with an OFF pulse and thus decreased to a low level. The power switch is turned on by a high-level gate signal, and is turned off by a low-level gate signal.

The ON pulse and the OFF pulse in the switch control device are generated by the power voltage. However, when it is not sensed that the power voltage is decreased lower than the low voltage (hereinafter, an abnormal state), the switch control device performs normal operation. Then, the decreased power voltage generates a low ON pulse and a low OFF pulse.

Particularly, when the power voltage is decreased to a transmission voltage VTRAN that is lower than the low voltage at a time point T1, an ON pulse or an OFF pulse generated after the time point T1 is not recognized as an ON or OFF pulse in the switch control device so that the gate signal is not changed according to the ON or OFF pulse.

The transmission voltage VTRAN implies a minimum voltage that can be recognized in the switch control device. That is, a voltage higher than the transmission voltage VTRAN in the switch control device is recognized such that it has an influence on the operation of the switch control device. However, a voltage that is lower than the transmission voltage VTRAN does not have any influence on the operation of the switch control device. Thus, when the ON pulse or the OFF pulse is lower than the transmission voltage VTRAN, the switch control device cannot recognize the ON or OFF pulse.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch control device that can stably generate a gate signal even though an abnormal state of a power voltage cannot be sensed.

A switch control device according to one aspect of the present invention controls a switching operation of a power switch, and includes an auxiliary power device including a parasitic capacitor and charging the parasitic capacitor by receiving a power voltage to generate an auxiliary power voltage, a control pulse generator driven by the auxiliary power voltage and generating a set pulse and a reset pulse according to an input signal that is input for controlling the switching operation of the power switch, and an output unit generating a gate signal that turns on the power switch by being synchronized with the set pulse and generating a gate signal that turns off the power switch by being synchronized with the reset pulse.

The auxiliary power device further includes a diode having a cathode connected to a first end of the parasitic capacitor and an anode to which the power voltage is input, and the parasitic capacitor is charged by a current flowing through the diode. The parasitic capacitor has capacity that can maintain the auxiliary power voltage to be higher than a predetermined transmission voltage when the power voltage is decreased lower than the transmission voltage, and the transmission voltage is a minimum voltage that can be recognized in the switch control device.

The auxiliary power device further includes a power capacitor having a first end connected to the cathode of the diode, and the power capacitor is charged by a current flowing through the diode. The power capacitor is set to have capacity that can maintain the auxiliary power voltage to be higher than a predetermined transmission voltage together with the parasitic capacitor when the power voltage is decreased lower than the transmission voltage, and the transmission voltage is a minimum voltage that can be recognized in the switch control device.

The auxiliary power device further includes a power capacitor and another diode having a cathode connected to a first end of the power capacitor and an anode to which the power voltage is input, and a voltage charged to the power capacitor is another auxiliary power voltage that is different from the auxiliary power voltage. The switch control device further includes a logic unit driven by the power voltage, and generating a high-voltage control signal by performing a logic operation on the low voltage sense signal that is generated when the input signal and the power voltage are lower than a predetermined low voltage.

The control pulse generator includes a first inverter driven by the other auxiliary voltage and generating an inverse high-voltage control signal by inverting the high-voltage control signal according to a comparison result between the high-voltage control signal and a first threshold voltage, a second inverter driven by the auxiliary power voltage and generating a compensation high-voltage control signal by inverting the inverse high-voltage control signal according to a comparison result between the inverse high-voltage control signal and a second threshold voltage that is lower than the first threshold voltage, and a short pulse generator generating an ON pulse or an OFF pulse according to the compensation high-voltage control signal.

The compensation high-voltage control signal has a decrease slope that is steeper than that of the high-voltage control signal. The parasitic capacitor has capacitor that can maintain the auxiliary power voltage to be higher than a predetermined transmission voltage when the power voltage is decreased lower than the transmission voltage, and the transmission voltage is a minimum voltage that can be recognized in the switch control device.

The power capacitor has capacitor that can maintain the other auxiliary power voltage to be higher than a predetermined transmission voltage when the power voltage is decreased lower than the transmission voltage, and the transmission voltage is a minimum voltage that can be recognized in the switch control device.

The switch control device further includes a logic unit driven by the power voltage, and generating a high-voltage control signal by performing a logic operation on the low voltage sense signal that is generated when the input signal and the power voltage are lower than a predetermined low voltage, and the control pulse generator is driven by the auxiliary power voltage and generating a set pulse and a reset pulse by being synchronized with the high-voltage control signal.

The present invention provides a switch control device that can stably generate a gate signal even though an abnormal state of a power voltage cannot be sensed.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Further, the drawings and description are to be regarded as illustrative in nature and not restrictive. Like reference numerals designate like elements throughout the specification.

Further, a case in which any one part is connected with the other part includes a case in which the parts are directly connected with each other and a case in which the parts are connected with each other with other elements interposed therebetween. In addition, unless explicitly described to the contrary, the word "comprise" and variations such as "comprises" or "comprising", will be understood to imply the inclusion of stated elements but not the exclusion of any other elements.

Figure 2:
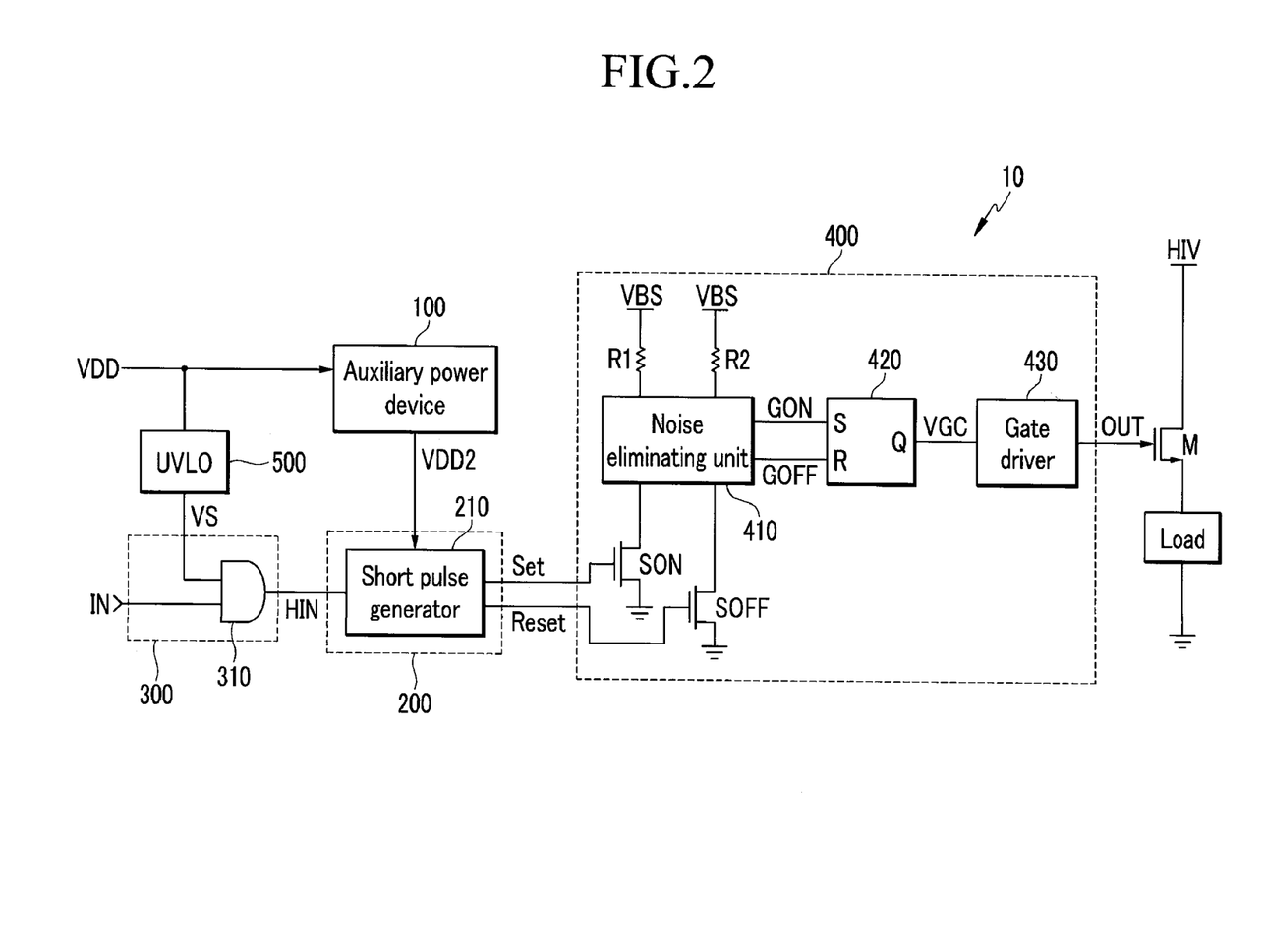
FIG. 2 shows a switch control device according to a first exemplary embodiment of the present invention.

FIG. 2 shows a switch control device according to a first exemplary embodiment of the present invention. A switch control device 10 includes an auxiliary power device 100.

Figure 3:
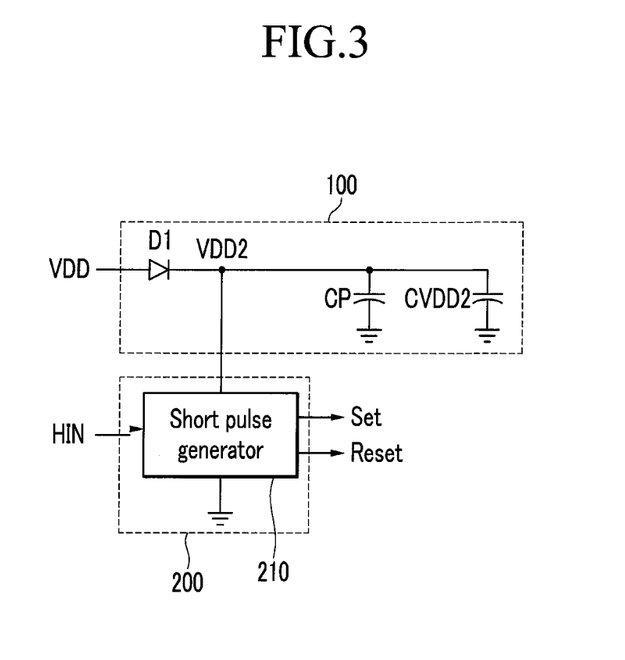
FIG. 3 shows an auxiliary power device and a short pulse generator connected thereto according to the first exemplary embodiment of the present invention.

FIG. 3 shows the auxiliary power device 100 and a short pulse generator 210 connected to the auxiliary power device 100 according to the first exemplary embodiment of the present invention.

As shown in FIG. 2, the switch control device 10 includes the auxiliary power device 100, a control pulse generator 200, a logic unit 300, an output unit 400, and a low voltage sensor 500.

The low voltage sensor 500 stops operation of the switch control device 10 when a power voltage VDD that is an operation voltage of the switch control device 10 is lower than a low voltage UVLO−. The low voltage may be the minimum voltage required for operation of the switch control device 10, while having a predetermined margin. In further detail, the switch control device 10 requires the power voltage supplied to the low voltage sensor 500 and the logic unit 300 and a power voltage VBS supplied to the output unit 400. The low voltage sensor 500 according to the first exemplary embodiment of the present invention generates a low voltage sense signal VS in low level when the power voltage VDD is lower than the low voltage UVLO−.

The switch control device 10 according to the first exemplary embodiment of the present invention further includes the auxiliary power device 100 that supplies an auxiliary power voltage VDD2 in addition to the control pulse generator 200 that generates a control pulse signal. The auxiliary power device 100 has a structure that generates the auxiliary power voltage VDD2 using the power voltage VDD, and this will be described with reference to FIG. 3.

The logic unit 300 generates a high-voltage control signal HIN according to an input signal IN generated from an external source and a low voltage sense signal VS. The input signal IN is a signal that determines a switching frequency and a duty of a power switch M that performs a switching operation according to a gate signal OUT transmitted from the switch control device 10. This may be generated from a pulse width modulation controller (not shown) included in the switch control device 10.

A high-voltage HIV is input to a drain electrode of the power switch M and a load is connected to a source electrode thereof. The power switch M is illustrated as an N channel type transistor, but the present invention is not limited thereto. Hereinafter, the gate signal OUT is set to have a high level to turn on the power switch M and a low level to turn off the power switch M.

The logic unit 300 includes an AND gate 310 as a logic operator. When the input signal IN and the low voltage sense signal VS are high level, the AND gate 310 generates a high-level high-voltage control signal HIN. Otherwise, the AND gate 310 generates a low-level high-voltage control signal HIN. Thus, the phase and the frequency of the high-voltage control signal HIN is equivalent to those of the input signal IN unless the power voltage VDD is decreased to be lower than the low voltage UVLO–.

The control pulse generator 200 generates a set pulse Set that increases the gate signal OUT to high level according to the high-voltage control signal HIN and a reset pulse Reset that decreases the gate signal OUT to low level. The control pulse generator 200 receives the auxiliary power voltage VDD2 from the auxiliary power device 100. In further detail, the control pulse generator 200 includes a short pulse generator 210, and generates a set pulse Set by being synchronized with a rising edge of the high-voltage control signal HIN and generates a reset pulse Reset by being synchronized with a falling edge of the high-voltage control signal HIN.

The auxiliary power device 100 generates the auxiliary power voltage VDD2 using the power voltage VDD and transmits the auxiliary power voltage VDD2 to the control pulse generator 200. The auxiliary power device 100 charges a parasitic capacitor CP and a power capacitor CVDD2 using the power voltage VDD, and a voltage charged in the parasitic capacitor CP and the power capacitor CVDD2 is the auxiliary power voltage VDD2.

As shown in FIG. 3, the auxiliary power device 100 includes a diode D1, the parasitic capacitor CP, and the power capacitor CVDD2. The diode D1 includes an anode to which the power voltage VDD is input and a cathode connected with the parasitic capacitor CP and the power capacitor CVDD2. The parasitic capacitor CP is a parasitic capacitor generated from the control pulse generator 200.

The power capacitor CVDD2 is used when the auxiliary power voltage cannot be maintained higher than a transmission voltage VTRAN using capacity of the parasitic capacitor CP. That is, an additional capacitor CVDD2 is not necessary when the parasitic capacitor CP1 is sufficiently large.

When the power capacitor CVDD2 is included in an auxiliary power supply, the size of the power capacitor CVDD2 may be determined according to the speed that the auxiliary power voltage VDD2 responds to variation of the power voltage VDD. The power voltage VDD and the response speed of the auxiliary power voltage VDD2 can be slowed down to a desired speed by increasing the size of the power capacitor CVDD2. However, when increasing the size of the power capacitor CVDD2, it should be considered that the increasing size of the switch control device 10 may cause a cost increase. The size of the parasitic capacitor CP should also be considered. That is, the size of the power capacitor CVDD2 can be decreased as the size of the parasitic capacitor CP is increased.

The output unit 400 generates and outputs the gate signal OUT according to the set pulse Set and the reset pulse Reset transmitted from the control pulse generator 200. The output unit 400 includes an ON switch SON, an OFF switch SOFF, a noise eliminator 410, a SR flip-flop 420, and a gate driver 430.

The noise eliminator 410 eliminates a noise generated from the switching operation of the ON switch SON and the OFF switch SOFF to generate an ON gate signal GON and an OFF gate signal GOFF according to the switching operation of the ON switch SON and the OFF switch SOFF.

The noise eliminator 410 generates a low-level ON gate signal GON when the ON switch SON is turned on, and generates a low-level OFF gate signal GOFF when the OFF switch SOFF is turned on. The noise eliminator 410 receives the power voltage VBS through resistors R1 and R2, generates the ON gate signal GON with the voltage transmitted through the resistor R1 when the ON switch SON is turned off, and generates the OFF gate signal GOFF with the voltage transmitted through the resistor R2 when the OFF switch SOFF is turned off. The voltage transmitted through the resistor R1 and the voltage transmitted through the resistor R2 are high level.

The level of the ON gate signal GON and the level of the OFF gate signal GOFF in the first exemplary embodiment of the present invention are exemplarily set, and the present invention is not limited thereto.

The SR flip-flop 420 includes a set terminal S to which the ON gate signal GON is input and a reset terminal R to which the OFF gate signal GOFF is input, and generates and outputs a gate control signal VGC according to the signals input to the set terminal S and the reset terminal R. The SR flip-flop 420 generates a high-level gate control signal VGC by using synchronized with a falling edge of the signal input to the set terminal S, and generates a low-level gate control signal VGC by using synchronized with a falling edge of the signal input to the reset terminal R.

The gate driver 430 is synchronized with a rising edge of the gate control signal VGC to generate a gate signal OUT in a level that can turn on the power switch M, and synchronized with a falling edge of the gate control signal VGC to generate a gate signal OUT in a level that can turn off the power switch M. The power switch M connected to the switch control device 10 according to the first exemplary embodiment of the present invention is an N channel type, and therefore the level that can turn on the power switch M is high level and the level that can turn off the power switch M is low level.

Figure 4:
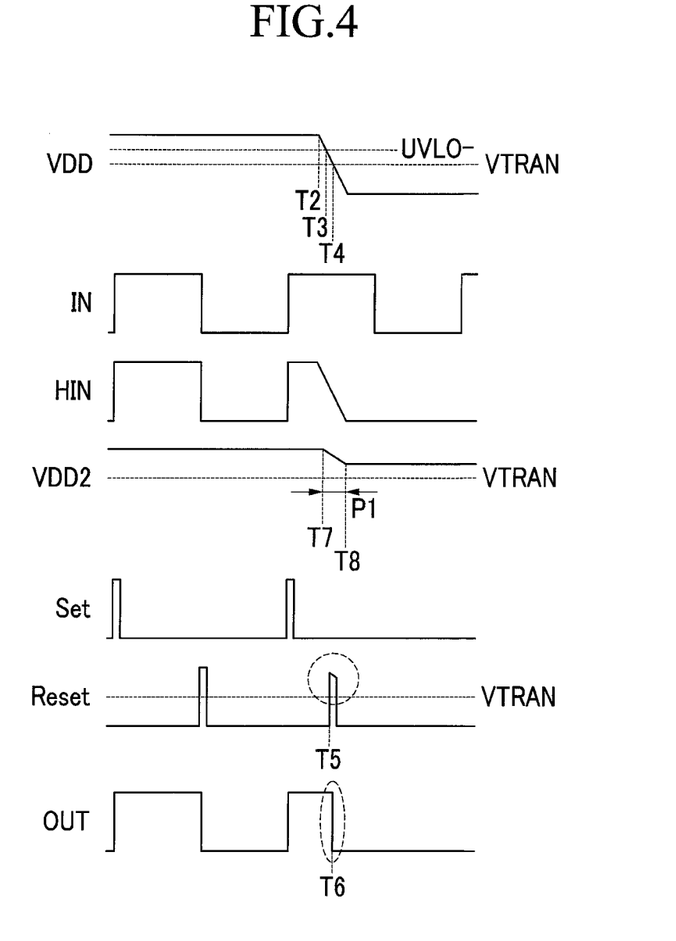
FIG. 4 is a waveform diagram of a power voltage, a high-voltage control signal, an auxiliary power voltage, a set pulse, a reset pulse, and a gate signal for description of the first exemplary embodiment of the present invention.

FIG. 4 is a waveform diagram of a power voltage, a high-voltage control signal, an auxiliary power voltage, a set pulse, a reset pulse, and a gate signal for description of the first exemplary embodiment of the present invention.

FIG. 4 illustrates that the power voltage VDD starts to decrease at a time point T2, decreases to the low voltage UVLO– at a time point T3, and decreased to be lower than the transmission voltage VTRAN after a time point T4. FIG. 4 exemplarily illustrates a waveform for description of the first exemplary embodiment of the present invention, and the operation of the switch controller 10 is not limited to the waveform of FIG. 4.

As shown in FIG. 4, when the power voltage VDD starts to decrease, the high-voltage control signal HIN, which is an output signal of the AND gate 310 that operates according to the power voltage VDD also starts to decrease.

The auxiliary power voltage VDD2 starts to decrease from a time point T7 rather than from than from the time point T2 by the power capacitor CVDD2 and the parasitic capacitor CP such that the auxiliary power voltage VDD2 maintains a constant level from a time point T8 at which the high-voltage control signal HIN becomes a ground voltage GROUND. Substantially, the auxiliary power voltage VDD2 is decreased after a time point T8 due to a current leaked from the power capacitor CVDD2 and the parasitic capacitor CP, but the degree of the decrease is very small. The auxiliary power voltage VDD2 decreased during a period P1 is maintained with a voltage that is higher than the transmission voltage VTRAN.

The short pulse generator 210 is synchronized at a time point T5 at which the high-voltage control signal HIN is decreased to be lower than a predetermined threshold voltage and generates a reset pulse Reset that is a high-level pulse. At a time point T6, the gate control signal becomes low level according to the reset pulse Reset.

When the auxiliary power device 100 is omitted and the control pulse generator 200 is driven by the power voltage VDD, the reset pulse Reset becomes higher than the transmission voltage VTRAN if the time point T5 precedes the time point T4 so that the output unit 400 cannot be normally driven. However, if the time point T5 does not precede the time point T4, the reset pulse Reset becomes lower than the transmission voltage VTRAN so that the output unit 400 may not recognize the reset pulse Reset. Then, as previously described, the gate signal OUT of FIG. 1 may be latched so that the power switch M may be maintained in the turn-on state.

The auxiliary power device according to the first exemplary embodiment of the present invention can solve such a problem by generating the auxiliary power voltage VDD2 that does not decrease lower than the transmission voltage VTRAN even though the power voltage VDD is decreased lower than the transmission voltage VTRAN.

Figure 5:
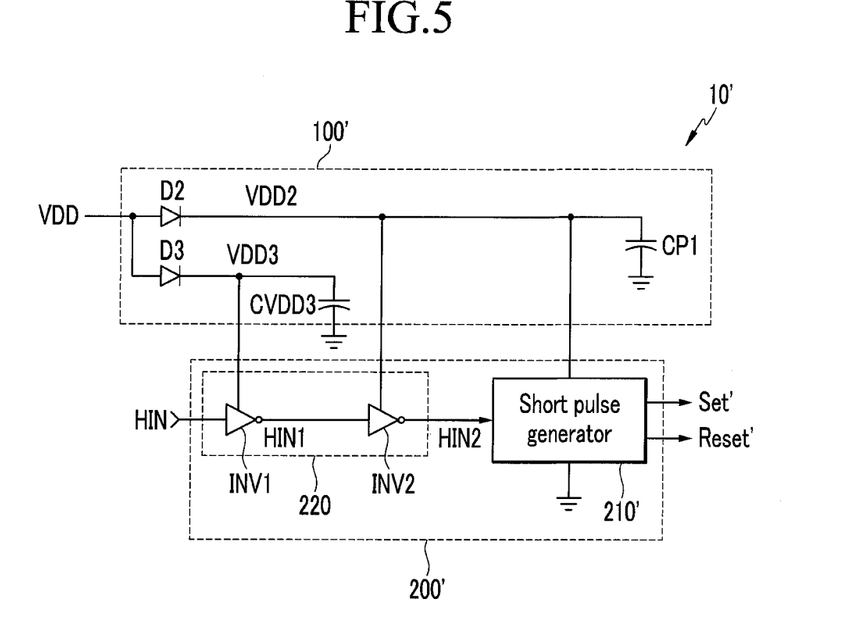
FIG. 5 shows an auxiliary power device according to a second exemplary embodiment of the present invention and a switch control device including the same.

FIG. 5 shows an auxiliary power device and a switch control device 10' including the same according to a second exemplary embodiment of the present invention. An auxiliary power device 100' according to the second exemplary embodiment of the present invention further includes a diode, and generates two auxiliary power voltages VDD2 and VDD3.

In addition, the switch control device 10' according to the second exemplary embodiment of the present invention includes a control pulse generator 200' including at least two inverters INV1 and INV2 for inclination compensation of a high-voltage control signal HIN.

As shown in FIG. 5, the auxiliary power device 100' includes two diodes D2 and D3, a power capacitor CVDD3, and a parasitic capacitor CP1. The parasitic capacitor CP1 is a parasitic capacitor formed in the control pulse generator 200'.

The diode D2 includes an anode to which a power voltage VDD is transmitted and a cathode connected to a first end of the parasitic capacitor CP1. The diode D3 includes an anode to which the power voltage VDD is transmitted and a cathode connected to a first end of the power capacitor CVDD3.

The parasitic capacitor CP1 is a parasitic capacitor generated from a short pulse generator 210' and the inverter INV2, and charged by a current transmitted through the diode D2. A voltage charged in the parasitic capacitor CP1 is an auxiliary power voltage VDD2. The auxiliary power voltage VDD2 charged in the parasitic capacitor CP1 is supplied to the short pulse generator 210' and the inverter INV2.

The first end of the power capacitor CVDD3 is connected to the inverter INV1, and the power capacitor CVDD3 is charged by the current transmitted through the diode D3. A voltage charged in the power capacitor CVDD3 is an auxiliary power voltage VDD3. The auxiliary power voltage VDD3 charged in the power capacitor CVDD3 is supplied to the inverter INV1.

In the first exemplary embodiment, the power capacitor CVDD2 and the parasitic capacitor CP are used to supply the auxiliary power voltage to the short pulse generator 210, but in the second exemplary embodiment, the auxiliary power voltage VDD2 is generated by the parasitic capacitor CP1. This is because that a capacity of the parasitic capacitor CP1 is sufficient to generate the auxiliary power voltage VDD2. That is, although the power voltage VDD is decreased lower than the transmission voltage VTRAN, the parasitic capacitor CP1 can maintain the auxiliary power voltage VDD2 to be higher than the transmission voltage VTRAN. If the parasitic capacitor CP1 has insufficient capacity, an additional power capacitor may be included in the auxiliary power device.

In addition, in the second exemplary embodiment, the auxiliary power device 100' further includes the power capacitor CVDD3 to generate the auxiliary power voltage VDD3. That is, although the power voltage VDD is decreased lower than the transmission voltage VTRAN, the power capacitor CVDD3 can maintain the auxiliary power voltage VDD3 to be higher than the transmission voltage VTRAN.

In the case that a parasitic capacitor having sufficient capacity to form the auxiliary power voltage VDD2 and the auxiliary power voltage VDD3 is formed in the auxiliary power device 100', the auxiliary power device 100' can generate the auxiliary power voltage VDD2 and the auxiliary power voltage VDD3 by using only the parasitic capacitor.

The control pulse generator 200' receives the high-voltage control signal HIN, the auxiliary power voltage VDD2, and the auxiliary power voltage VDD3, generates a compensation high-voltage control signal HIN2 by being synchronized with rising or falling of the high-voltage control signal HIN, and generates a set pulse Set and a reset pulse Reset according to the compensation high-voltage control signal HIN2. The compensation high-voltage control signal HIN2 is a signal that has a steep slope when being increased or decreased compared to the high-voltage control signal HIN.

In the first exemplary embodiment, the high-voltage control signal HIN is decreased as the power voltage VDD is decreased. The short pulse generator 210 generates the reset pulse Reset by being synchronized with a falling edge of the high-voltage control signal HIN, and a delay may occur when the short pulse generator 200 generates the reset pulse Reset if a falling edge of the high-voltage control signal HIN has a gentle slope. In the second exemplary embodiment of the present invention, a compensation high-voltage control signal HIN2 that is decreased with a steeper slope is generated by compensating a falling slope of the high-voltage control signal HIN. Then, the short pulse generator 210' can generate the reset pulse Reset more promptly compared to the first exemplary embodiment.

The control pulse generator 200' includes a short pulse generator 210' and a slope compensator 220. Compared to the short pulse generator 210 of the first exemplary embodiment, the short pulse generator 210' generated a set pulse Set' and a reset pulse Reset' according to a compensation high-voltage control signal HIN' using a structure that is different from that of the short pulse generator 210 but the operation principle is the same as that of the short pulse generator 210.

The slope compensator 220 includes an inverter INV1 generating an inverse high-voltage control signal HIN1 by inverting the high-voltage control signal HIN and an inverter INV2 generating a compensation high-voltage control signal HIN2 by inverting the inverse high-voltage control signal HIN1.

The inverter INV1 inverts the high-voltage control signal HIN with reference to a predetermined threshold voltage Vth1 to generate the inverse high-voltage control signal HIN1. That is, when the high-voltage control signal HIN is higher than the threshold voltage Vth1, the inverter INV1 recognizes the high-voltage control signal HIN as a high level signal and generates a low-level inverse high-voltage control signal HIN1. When the high-voltage control signal HIN is lower than the threshold voltage Vth1, the inverter INV1 recognizes the high-voltage control signal HIN as a low level signal and generates a high-level inverse high-voltage control signal HIN1.

The inverter INV2 inverts the inverse high-voltage control signal HIN1 with reference to a predetermined threshold voltage Vth2 to generate a compensation high-voltage control signal HIN2. That is, when the inverse high-voltage control signal HIN1 is higher than the threshold voltage Vth2, the inverter INV2 recognizes the inverse high-voltage control signal HIN1 as a high level signal and generates a low-level compensation high-voltage control signal HIN2. However, when the inverse high-voltage control signal HIN1 is lower than the threshold voltage Vth2, the inverter INV2 recognizes the inverse high-voltage control signal HIN1 as a low level signal and generates a high-level compensation high-voltage control signal HIN2.

The threshold voltage Vth2 of the inverter INV2 is lower than the threshold voltage Vth1 of the inverter INV1. Then, the inverter INV2 recognizes a lower input signal as a high level signal compared to the inverter INV1 and generates a low-level output signal. Thus, a decrease start time point of the compensation high-voltage control signal HIN2 is advanced so that a generation time point of the reset pulse Reset' may be advanced.

However, the present invention is not limited thereto, and a voltage level of the threshold voltage Vth2 can be set appropriately, so that a reset pulse generation time point of the compensation high-voltage control signal HIN2 may be prior to a reset pulse generation time point of a conventional high-voltage control signal HIN. In the exemplary embodiment of the present invention, the threshold voltage Vth2 is set to be lower than the threshold voltage Vth1, but the two voltages may have the same level. That is, the threshold voltage Vth2 may be set to be lower than the threshold voltage Vth1.

Figure 6:
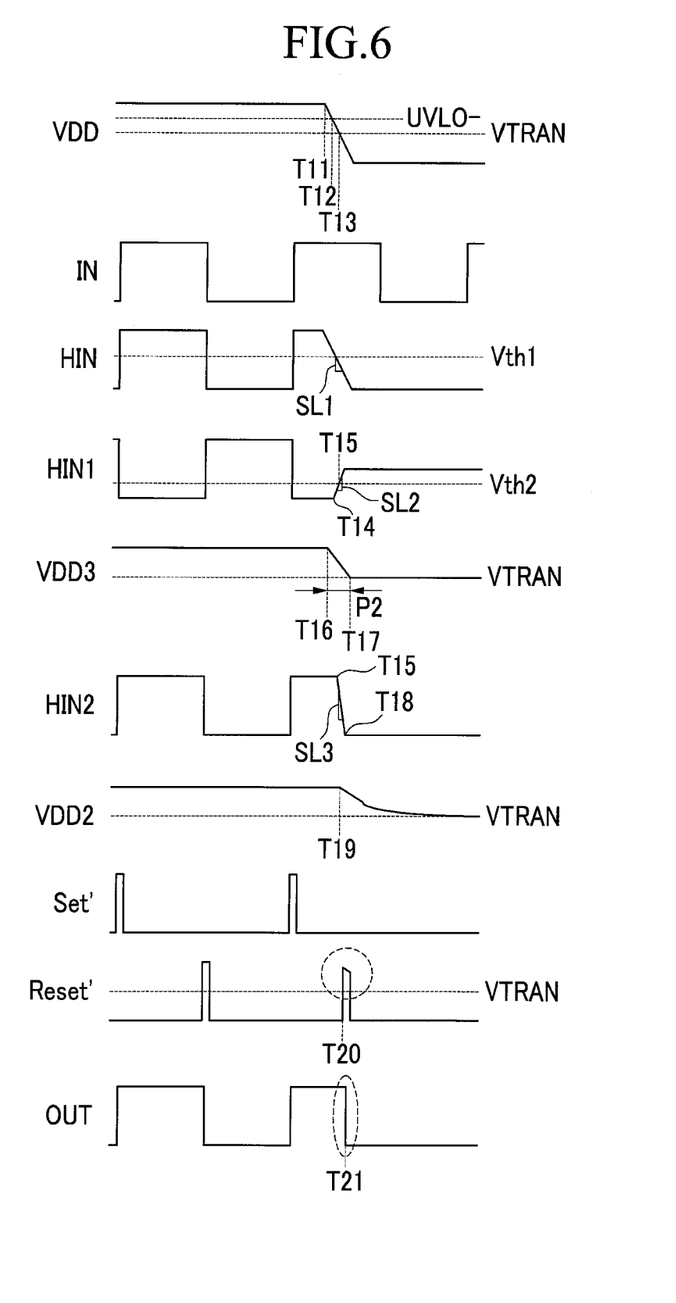
FIG. 6 is a waveform diagram of a power voltage, a high-voltage control signal, an inverse high-voltage control signal, a compensation high-voltage control signal, an auxiliary power voltage, a set pulse, a reset pulse, and a gate signal for description of the second exemplary embodiment of the present invention.

FIG. 6 is a waveform diagram of a power voltage, a high-voltage control signal, an inverse high-voltage control signal, a compensation high-voltage control signal, an auxiliary power voltage, a set pulse, a reset pulse, and a gate signal for description of the second exemplary embodiment of the present invention.

FIG. 6 illustrates that the power voltage VDD starts to decrease from a time point T11, is decreased to the low voltage UVLO– at a time point T12, and is lower than the transmission voltage VTRAN after a time point T13. The waveform in FIG. 6 is an exemplary waveform for description of the second exemplary embodiment of the present invention, and the present invention is not limited to the waveform of FIG. 6.

As shown in FIG. 6, the auxiliary power voltage VDD3 starts to decrease from a time point T16 rather than from the time point T11 by the power capacitor CVDD3 and is constantly maintained at a specific voltage level from a time point T17.

The auxiliary power voltage VDD2 starts to decrease from a time point T19 rather than from the time point T11 by the parasitic capacitor CP1 and is maintained at a specific voltage level.

FIG. 6 illustrates that the auxiliary power voltage VDD3 and the auxiliary power voltage VDD2 are decreased and then maintained with the transmission voltage VTRAN, but the present invention is not limited thereto. That is, the auxiliary power voltage VDD3 and the auxiliary power voltage VDD2 are decreased and then may be maintained at a high-voltage level that is higher than the transmission voltage VTRAN.

When the power voltage VDD starts to decrease, the high-voltage control signal HIN also starts to decrease. The high-voltage control signal HIN1 is decreased with a slope SL1 due to the decrease of the power voltage VDD.

From after a time point T14 at which the high-voltage control signal HIN reaches the threshold voltage Vth1, the inverter INV1 starts to increase the inverse high-voltage control signal HIN1 to generate a high-level inverse high-voltage control signal HIN1. Since the inverse high-voltage control signal HIN1 is multiplied by a voltage gain of the inverter INV1 from the high-voltage control signal HIN, the inverse high-voltage control signal HIN1 is rapidly increased with a slope SL2 that is steeper than the slope SL1.

When the inverse high-voltage control signal HIN1 reaches the threshold voltage Vth2 at the time point T15, the inverter INV2 starts to decrease the compensation high-voltage control signal HIN2 to generate a low-level compensation high-voltage control signal HIN2. Since the threshold voltage Vth2 is lower than the threshold voltage Vth1, a decrease start time point of the compensation high-voltage control signal HIN2 is advanced. Thus, a decrease slope SL3 of the compensation high-voltage control signal HIN2 is steeper than the decrease slope SL1 of the high-voltage control signal HIN, and the compensation high-voltage control signal HIN2 is more quickly decreased. Furthermore, the slope SL3 is steeper than not only the slope SL1 but also the slope SL2, and the slope SL2 is steeper than the slope SL1.

In the second exemplary embodiment of the present invention, the compensation high-voltage control signal is generated using two inverters INV1 and INV2, but the present invention is not limited thereto. A slope compensation unit further includes an inverter having a further lower threshold, and an input terminal of the inverter may be connected to an output terminal of the inverter INV2. That is, the slope of the high-voltage control signal can be compensated using at least two inverters according to the present exemplary embodiment.

When the decrease of the compensation high-voltage control signal HIN2 is ended at a time point T18, the short pulse generator 210' senses a falling edge of the compensation high-voltage control signal HIN2 and generates a reset pulse Reset' that is higher than the transmission voltage VTRAN at a time point T20. Then, the gate driver generates a gate signal OUT that decreases to a low level at a time point T21.

As described, the switch control device according to the second exemplary embodiment of the present invention compensates the slope of the high-voltage control signal to promptly respond abnormality in the power voltage such that latch of the output signal can be prevented.

According to the present exemplary embodiment, although the UVLO 500 is before responding the decrease of the power voltage VDD or is responding the decrease of the power voltage VDD if the power voltage VDD is lower than the transmission voltage VTRAN, the high-voltage control signal HIN and the compensation high-voltage control signal HIN2 can be quickly decreased.

In addition, when no UVLO 500 sensing the decrease of the power voltage VDD is provided, the high-voltage control signal HIN and the compensation high-voltage control signal HIN2 can be quickly decreased according to the decrease of the power voltage VDD. When the power voltage VDD starts to decrease, the high-voltage control signal HIN also starts to decrease. According to the exemplary embodiments of the present invention, abnormality in the power voltage can be promptly sensed by sensing a decrease of the high-voltage control signal HIN or increasing the decrease speed of the high-voltage control signal HIN.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, it will be appreciated to those skilled in the art that various modifications are made and other equivalent embodiments are available. Accordingly, the actual scope of the present invention must be determined by the spirit of the appended claims.

DESCRIPTION OF SYMBOLS switch control device 10, 10', auxiliary power device 100, 100' control pulse generator 200, 200', short pulse generator 210, 210' logic unit 300, output unit 400, low voltage sensor 500, AND gate 310 diode D1, D2, and D3, parasite capacitor CP, CP1 power capacitor CVDD2, CVDD3, ON switch SON, OFF switch SOFF, noise eliminator 410, SR flip-flop 420, gate driver 430 slope compensator 220, inverter INV1 and INV2

What is claimed is:

1. A switch control device that controls a switching operation of a power switch, comprising:
   an auxiliary power device including a parasitic capacitor, and charging the parasitic capacitor by receiving a power voltage to generate an auxiliary power voltage;
   a logic unit receiving an input signal that is input for controlling the switching operation of the power switch, the logic unit being driven by the power voltage but not by the auxiliary voltage during a normal operation;
   a control pulse generator driven by the auxiliary power voltage during the normal operation, and generating a set pulse to be higher than a predetermined transmission voltage and a reset pulse according to the input signal, wherein the control pulse generator generates the set pulse and the reset pulse as two separate signals; and
   an output unit generating a gate signal that turns on the power switch by being synchronized with the set pulse, and generating a gate signal that turns off the power switch by being synchronized with the reset pulse.

2. The switch control device of claim 1, wherein the auxiliary power device further comprises a diode having a cathode connected to a first end of the parasitic capacitor and an anode to which the power voltage is input, and the parasitic capacitor is charged by a current flowing through the diode.

3. The switch control device of claim 2, wherein the parasitic capacitor has capacity that can maintain the auxiliary power voltage to be higher than the predetermined transmission voltage when the power voltage is decreased to be lower than the transmission voltage, and the transmission voltage is a minimum voltage that can be recognized in the switch control device.

4. The switch control device of claim 2, wherein the auxiliary power device further comprises a power capacitor having a first end connected to the cathode of the diode, and the power capacitor is charged by a current flowing through the diode.

5. The switch control device of claim 4, wherein the power capacitor is set to have capacity that can maintain the auxiliary power voltage to be higher than the predetermined transmission voltage together with the parasitic capacitor when the power voltage is decreased to be lower than the transmission voltage, and the transmission voltage is a minimum voltage that can be recognized in the switch control device.

6. The switch control device of claim 2, wherein the auxiliary power device further comprises:
   a power capacitor and another diode having a cathode connected to a first end of the power capacitor and an anode to which the power voltage is input, and
   a voltage charged to the power capacitor is another auxiliary power voltage that is different from the auxiliary power voltage.

7. The switch control device of claim 6, further comprising a logic unit driven by the power voltage, and generating a high-voltage control signal by performing a logic operation on a low voltage sense signal that is generated when the input signal and the power voltage are lower than a predetermined low voltage.

8. The switch control device of claim 7, wherein the control pulse generator comprises:
   a first inverter driven by the other auxiliary voltage and generating an inverse high-voltage control signal by inverting the high-voltage control signal according to a comparison result between the high-voltage control signal and a first threshold voltage; a second inverter driven by the auxiliary power voltage and generating a compensation high-voltage control signal by inverting the inverse high-voltage control signal according to a comparison result between the inverse high-voltage control signal and a second threshold voltage that is lower than the first threshold voltage; and
   a short pulse generator generating an ON pulse or an OFF pulse according to the compensation high-voltage control signal.

9. The switch control device of claim 8, wherein the compensation high-voltage control signal has a decrease slope that is steeper than that of the high-voltage control signal.

10. The switch control device of claim 8, wherein the parasitic capacitor has capacitor that can maintain the auxiliary power voltage to be higher than a predetermined transmission voltage when the power voltage is decreased lower than the transmission voltage, and the transmission voltage is a minimum voltage that can be recognized in the switch control device.

11. The switch control device of claim 8, wherein the power capacitor has capacitor that can maintain the other auxiliary power voltage to be higher than a predetermined transmission voltage when the power voltage is decreased lower than the transmission voltage, and the transmission voltage is a minimum voltage that can be recognized in the switch control device.

12. The switch control device of claim 1, wherein the logic unit generates a high-voltage control signal by performing a logic operation on the input signal and a low voltage sense signal that is generated when the power voltage is lower than a predetermined low voltage, and the control pulse generator is driven by the auxiliary power voltage and generates a set pulse and a reset pulse by being synchronized with the high-voltage control signal.

13. The switch control device of claim 12, wherein the auxiliary power device further comprises a diode having a cathode connected to a first end of the parasitic capacitor and an anode to which the power voltage is input, and the parasitic capacitor is charged by a current flowing through the diode.

14. The switch control device of claim 13, wherein the parasitic capacitor has capacitor that can maintain the auxiliary power voltage to be higher than a predetermined transmission voltage when the power voltage is decreased lower than the transmission voltage, and the transmission voltage is a minimum voltage that can be recognized in the switch control device.

15. The switch control device of claim 13, wherein the auxiliary power device further comprises a power capacitor having a first end connected to the cathode of the diode, and the power capacitor is charged by a current flowing through the diode.

16. The switch control device of claim 15, wherein the power capacitor is set to have capacity that can maintain the auxiliary power voltage to be higher than a predetermined transmission voltage together with the parasitic capacitor when the power voltage is decreased lower than the transmission voltage, and the transmission voltage is a minimum voltage that can be recognized in the switch control device.

* * * * *